United States Patent [19]

Tasch, Jr. et al.

[11] 4,409,724
[45] Oct. 18, 1983

[54] METHOD OF FABRICATING DISPLAY WITH SEMICONDUCTOR CIRCUITS ON MONOLITHIC STRUCTURE AND FLAT PANEL DISPLAY PRODUCED THEREBY

[75] Inventors: Aloysious F. Tasch, Jr.; Perry A. Penz, both of Richardson; John M. Pankratz, Plano; Hon W. Lam, Dallas, all of Tex.

[73] Assignee: Texas Instruments Incorporated, Dallas, Tex.

[21] Appl. No.: 202,899

[22] Filed: Nov. 3, 1980

[51] Int. Cl.³ .................... H01L 21/268; H01L 21/28
[52] U.S. Cl. .................................. 29/571; 29/569 L; 29/576 B; 29/577 C; 148/174; 148/187; 148/1.5; 357/41
[58] Field of Search ................. 29/571, 576 B, 569 L, 29/577 C; 148/1.5, 187, 174, 175; 357/41

[56] References Cited

U.S. PATENT DOCUMENTS

| | | | |
|---|---|---|---|
| 3,765,747 | 10/1973 | Pankratz et al. | 148/1.5 X |
| 4,050,965 | 9/1977 | Ipri et al. | 148/175 |
| 4,059,461 | 11/1977 | Fan et al. | 148/187 X |
| 4,103,297 | 7/1978 | McGreivy et al. | 357/41 X |
| 4,239,346 | 12/1980 | Lloyd | 357/41 X |
| 4,267,011 | 5/1981 | Shibata et al. | 148/187 X |
| 4,309,225 | 1/1982 | Fan et al. | 148/1.5 |
| 4,312,680 | 1/1982 | Hsu | 29/571 X |

*Primary Examiner*—G. Ozaki
*Attorney, Agent, or Firm*—Melvin Sharp; James T. Comfort; Robert Groover

[57] ABSTRACT

Method of fabricating a display with silicon integrated circuits included on the same monolithic structure and the flat panel display produced thereby. The display which may be of the liquid crystal or electrochromic type, for example, is formed as an x-y matrix display having individual address transistors respectively asociated with each of the display units or pixels. The substrate is preferably of transparent material, such as quartz or a glass plate, on which a polysilicon layer is disposed. The polysilicon layer is patterned to provide a plurality of islands which are subjected to a laser annealing treatment at an intensity sufficient to cause re-crystallization thereof. The polysilicon material in the islands is converted by the laser annealing to crystalline silicon having an enhanced electron mobility characteristic such that a matrix array of address transistors in the form of MOSFETS can be fabricated in the individual islands. Thereafter, elements of the display are formed in conjunction with the matrix array of address transistors, beginning with the formation of an array of metal electrodes in respective association with corresponding address transistors. Various peripheral circuits for the display, such as drive circuits, are formed in other islands of crystalline silicon resulting from the laser annealing of the polysilicon islands such that a monolithic structure including a display with silicon integrated circuits for operating the display is produced.

26 Claims, 16 Drawing Figures

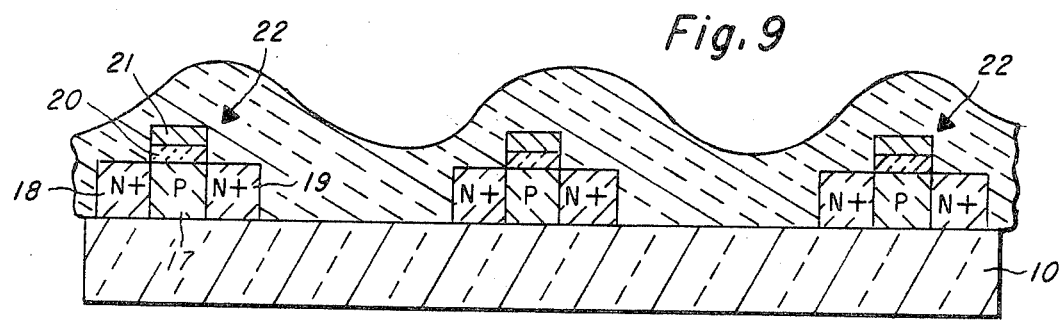
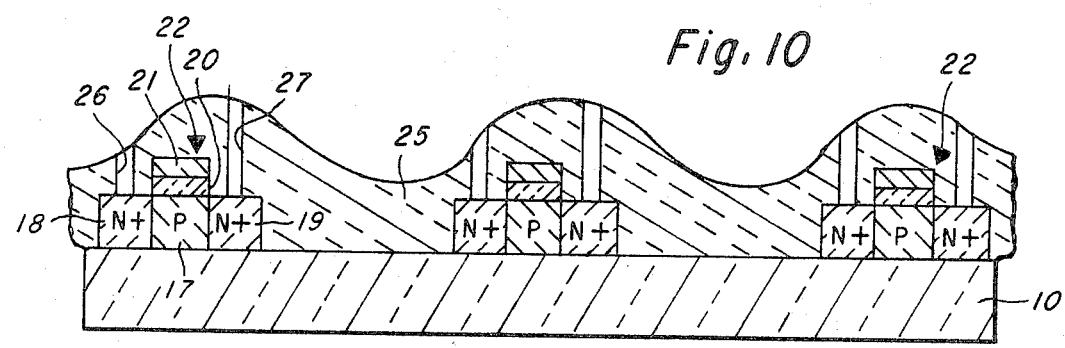
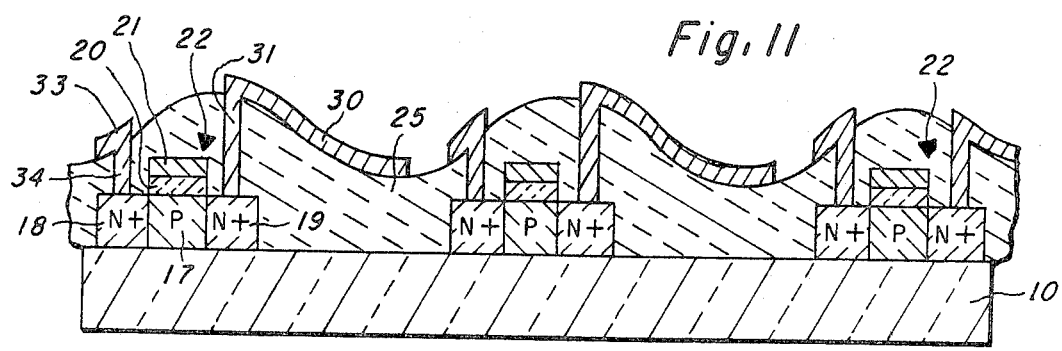

METHOD OF FABRICATING DISPLAY WITH SEMICONDUCTOR CIRCUITS ON MONOLITHIC STRUCTURE AND FLAT PANEL DISPLAY PRODUCED THEREBY

BACKGROUND OF THE INVENTION

This invention is directed to a method of fabricating a display with semiconductor integrated circuits combined therewith on the same substrate as a monolithic display structure and a flat panel display as so formed thereby. More specifically, the invention concerns a method of fabricating a display, which may be of the liquid crystal or electrochromic type, for example, as an x-y matrix display with a corresponding array of silicon address transistors in the form of metal-oxide-semiconductor field effect transistors (MOSFETS) on a monolithic structure and the flat panel display produced thereby, wherein polysilicon material as disposed on a substrate such as transparent quartz or a glass plate is subjected to a laser annealing treatment to enable the formation of silicon integrated circuits in the resulting crystalline silicon including the address transistors for the matrix display by enhancing the electron mobility characteristic of the laser-annealed polysilicon material.

Basically, a visual electronic display requires appropriate electrical stimulation at various positions in the plane where the information to be displayed is being written. Conversion of the electrical stimulation into an optical signal by an electrooptic element, such as a liquid crystal material in concert with respective electrodes, or an electrochromic or electroluminescent element, is then necessary to provide the visual display. Large information content displays require a structure in which a spatially inhomogeneous distribution of charge independent of the number of elements in the total display is accomplished. Heretofore, x-y matrix addressing has been effective for low and intermediate information content displays, but falters when the display is expanded in size to be one of large information content (i.e., where the number N of lines driven is greater than 100). In this connection, direct matrix addressing of N lines only presents the display data to a given line 1/N of the refresh time—typically 30 nsec. As N increases, either the display element will not give sufficient light or the contrast of the display decreases to such an extent that the display becomes unusable. In order to obtain high brightness and/or high contrast for large magnitude of N, the electronic signal to a given display cell unit or pixel must be made independent of N. This is accomplished by providing a switch for each pixel so that the pixel is connected for a substantial portion of the refresh time to its own dedicated source of data. $N^2$ switches are required to do this which involves a switch-distribution problem.

Such electronic x-y matrix displays have been the subject of intensive efforts to develop a reliable structure capable of handling a large information content. One such proposal involves the use of deposited thin film transistors (TFT's) on glass, wherein the transistors are fabricated from CdS or CdSe. This type of display suffers from low reliability in terms of number of total cycle times before breakdown and generally has an unsatisfactory relatively short lifetime.

Another approach to the x-y matrix display has involved the fabrication of switching transistors on a monocrystalline silicon substrate. This approach necessitates the fabrication of monocrystalline silicon over the large display area which is required for human interaction resulting in significant costs, and further suffering from the drawback that the monocrystalline silicon substrate is opaque to light.

Thus, efforts to develop reliable display structures in which the peripheral circuitry including circuitry to drive the respective display electrode elements is disposed on the same substrate as the display elements have generally been unavailing heretofore for a variety of reasons. One such instance of a display device combined with peripheral electronics for driving the display in a monolithic structure is disclosed in U.S. Pat. No. 3,765,747 Pankratz et al issued Oct. 16, 1973, wherein a liquid crystal display is combined with driver circuitry on the same substrate. The liquid crystal display is described as being either of the seven segment type as used for displaying numbers between 0 and 9 or as a dot display in which the pattern to be displayed is formed on a series of dots arranged in an x-y matrix. In liquid crystal displays using matrix addressing to generate a dot-type display, the character to be displayed is defined by a series of dots which are placed at positions conforming to the outline of the desired pattern. In the aforesaid U.S. Pat. No. 3,765,747, the liquid crystal display of dot-type is defined on a substrate of silicon material of one conductivity type wherein a plurality of diodes are formed on the substrate, such that each diode is respectively disposed in series with a corresponding one of the display elements to enable the addressing of the matrix in the so-called scan mode. In this connection, first and second sets of electrodes which are orthogonally oriented with respect to each other are provided on the substrate, with one first set of electrodes being formed in one surface of the substrate as a series of thin parallel conductors, and the second set of electrodes being formed as conductive strips in a patterned conductive layer applied as a coating to the top transparent electrode of the display. The intersection points of respective electrodes of the two sets define a matrix of points or dots corresponding to the respective diodes and the display elements connected in series therewith. By applying voltages to selected elements of each of the two sets of orthogonally related electrodes, the crossing points of those electrodes which are energized bias the liquid crystal composition therebetween to cause light modulation in a manner displaying a dot. By selectively energizing the first and second sets of orthogonally related electrodes, the liquid crystal composition can be addressed in the so-called x-y scan mode with each of the display elements having an isolated and individual diode in series therewith to define a dot matrix liquid crystal display.

The aforesaid liquid crystal display of an x-y matrix dot type as disclosed in U.S. Pat. No. 3,765,747 has a light-opaque monocrystalline silicon substrate in the manner of the previously discussed approach wherein switching transistors are proposed in conjunction with the individual display cell units or pixels rather than diodes, although a description of a transparent mode liquid crystal display device occurs therein on the assumption that a silicon substrate may be thinned sufficiently to be light-transmissive.

SUMMARY OF THE INVENTION

The present invention is concerned with a method of fabricating a display with semiconductor integrated circuits combined therewith on the same substrate as a monolithic display structure and a flat panel display as so formed thereby, wherein the substrate can be formed of a transparent material on which polycrystalline semiconductor islands are disposed, and laser annealing of the polycrystalline semiconductor islands is relied upon to convert the polycrystalline semiconductor material of the islands to crystalline semiconductor material having an enhanced electron mobility characteristic sufficient to enable semiconductor devices, such as metal-oxide-semiconductor field effect transistors (MOSFETS), to be fabricated therein. While the invention contemplates that the flat panel display as so fabricated may be of the alphanumeric type offering seven segment electrodes for displaying numbers between 0 and 9, the invention more readily lends itself to an x-y matrix display which may be of the liquid crystal or electrochromic type for example, and includes individual address transistors respectively associated with each of the display units or pixels. The transparent substrate may be quartz or a glass plate, and the polycrystalline semiconductor islands disposed thereon are preferably of polysilicon material which is converted by the laser annealing treatment to crystalline silicon having an enhanced electron mobility characteristic such that a matrix array of address transistors in the form of MOSFETS can be fabricated in the individual islands. To this end, the polysilicon islands are subjected to a laser annealing scan wherein the heat generated is at an intensity sufficient to cause recrystallization of the polysilicon material in the islands to crystalline silicon having a substantially enlarged grain size and offering a much higher electron mobility characteristic than prior to the laser annealing treatment.

After fabrication of the MOSFETS in the individual islands, elements of the display are then formed in conjunction with the matrix array of address transistors as provided by the MOSFETS, beginning with the formation of an x-y matrix array of conductive electrodes in respective association with corresponding address transistors. In the case of a liquid crystal display structure, the uppermost transparent electrode is formed over the assembly in spaced relationship with respect to the x-y matrix of electrodes, being provided with a conductive transparent coating therebeneath, and a liquid crystal composition is introduced into the space between the upper transparent electrode and the x-y matrix electrodes. First and second sets of parallel electrodes with the first electrode set being orthogonally oriented with respect to the second electrode set are provided on the display structure as respective series of thin parallel conductors. The intersection points of respective electrodes of the two sets then define a matrix of points corresponding to the respective address transistors and the display cell units or pixels associated therewith. The application of voltages to selected elements of each of the two sets of orthogonally related electrodes causes selected address transistors corresponding to the crossing points of those electrodes to be rendered conductive, thereby energizing the display cell units (i.e., electrodes) associated therewith to dispose a potential across the liquid crystal composition to cause light modulation in displaying respective dots as electrodes included in the x-y matrix of electrodes.

In its basic embodiment, the process of fabricating a monolithic display structure in accordance with present invention initially involves the provision of a layer of polysilicon material directly onto a substrate which preferably is of transparent material, such as quartz or a glass plate. The polysilicon layer is then patterned by appropriate photolithography or other suitable means to define a plurality of islands of polysilicon material disposed in spaced relationship with respect to each other on the substrate. These polysilicon islands in one aspect of the method herein contemplated are formed of substantially uniform size in a generally checkerboard pattern. The polysilicon islands are then scanned by a laser operated at an intensity to cause annealing and recrystallization of the polysilicon material. This laser annealing treatment converts the polysilicon material in the islands to crystalline silicon having a substantially enlarged grain size and an enhanced electron mobility characteristic of a magnitude suitable for forming electronic devices, such as transistors, therein. The laser annealing treatment of the individual islands of polysilicon material produces some distortion in the islands about the marginal portions thereof. Such laser-induced distorted regions and any unannealed edge regions are then removed from each of the crystalline silicon islands by an appropriate etchant procedure, such as plasma etching. The address transistors for the respective electrodes of the x-y matrix display are then fabricated in the crystalline silicon islands by appropriately doping adjoining regions of the crystalline silicon islands with first and second conductivity type dopants to form transistor structures, followed by appropriate formation of gate oxide layers and gate electrode layers in defining the individual MOSFET address transistors. Thereafter, the x-y matrix electrode components of the display are formed on the substrate assembly, with each x-y matrix electrode component being electrically connected to a corresponding MOSFET address transistor. The display is then completed by adding the top transparent electrode having a conductive transparent coating on its surface opposed to the x-y matrix electrode components of the display disposed on the substrate assembly, and electro-optic material, such as a liquid crystal composition, is then introduced into the space between the lower electrodes and the upper transparent electrode to complete the monolithic display structure as a flat panel display.

In another aspect of the method, the islands of polysilicon material may be initially formed as elongated islands extending across one dimensional extent of the contemplated monolithic display structure, with the elongated islands being then subjected to scanning thereof by a laser beam maintained at an intensity sufficient to cause annealing and recrystallization of each elongated island of polycrystalline material. Thus, the polycrystalline material in the elongated islands is converted to crystalline silicon material having an enhanced electron mobility characteristic in response to the laser annealing treatment thereof, and the unannealed edge regions and laser-induced distorted regions are then removed from each of the elongated islands of crystalline silicon material. Thereafter, a second patterning step is carried out, wherein the elongated islands of crystalline silicon material are subdivided into a plurality of smaller islands of crystalline silicon material for subsequent fabrication of electronic devices therein in the manner previously described. This latter approach, although requiring two separate patterning steps with respect to the initial layer of polycrystalline silicon material and the subsequent elongated islands of crystalline silicon material as laser annealed, offers the advantage of removing unannealed edge regions and laser-induced distorted regions from the marginal portions of a relatively limited number of elongated islands of crystalline silicon material such that the subsequent patterning of such elongated islands of crystalline silicon material is carried out in a manner producing a plurality of smaller islands of crystalline silicon material whose composite volume is somewhat greater than the volume of crystalline silicon material in the plurality of islands produced by the aspect of the method involving only an initial patterning step with respect to the layer of polycrystalline material.

Thus, a monolithic display structure is fabricated in a flat panel form on a relatively inexpensive transparent substrate by utilizing polycrystalline semiconductor material subjected to a laser annealing treatment to enable semiconductor transistors to be formed therein offering acceptable operating parameters for addressing individual display cell electrode units or pixels and providing peripheral drive circuitry for the display structure. By permitting both the substrate and the upper electrode structure to be formed of transparent material, the method in accordance with the present invention can be employed to fabricate a monolithic liquid crystal display structure operable in the preferred twisted nematic mode in which the individual silicon integrated devices comprising the MOSFET address transistors for each display cell unit or pixel are of minimum size with respect to the transparent electrode area to provide for a picture of high quality.

The method of fabricating a monolithic display structure, although preferably directed to the fabrication of a liquid crystal display, is also suitable for fabricating other types of stored information displays, such as electrochromic or electroluminescent displays, for example. In addition, while laser annealing is a preferred treatment to convert polysilicon material to a crystalline silicon with a sufficiently enhanced electron mobility characteristic to enable electronic devices to be formed therein, it is also contemplated that other material annealing focused energy sources, such as an electron beam, for example, could be employed for this purpose, provided the polysilicon material is converted to a crystalline silicon of large grain character approaching a single crystal or near single crystal orientation.

BRIEF DESCRIPTION OF THE DRAWINGS

The invention as well as other features and advantages thereof will become apparent from the following detailed description when taken in connection with the appended claims and the accompanying drawings in which:

FIG. 9 is a cross-sectional view showing a further stage in the method, wherein insulating material has been deposited on the substrate and the semiconductor devices formed thereon;

FIG. 10 is a cross-sectional view, similar to FIG. 9, but showing a further stage in the method, wherein openings have been formed in the deposited insulating material exposing portions of the semiconductor devices;

FIG. 11 is a cross-sectional view of a subsequent stage in the method, wherein a metallization layer has been deposited onto the body of insulating material and patterned to form an x-y matrix array of display electrodes respectively defining a single display cell unit or pixel;

DETAILED DESCRIPTION OF THE DRAWINGS

Figure 1:
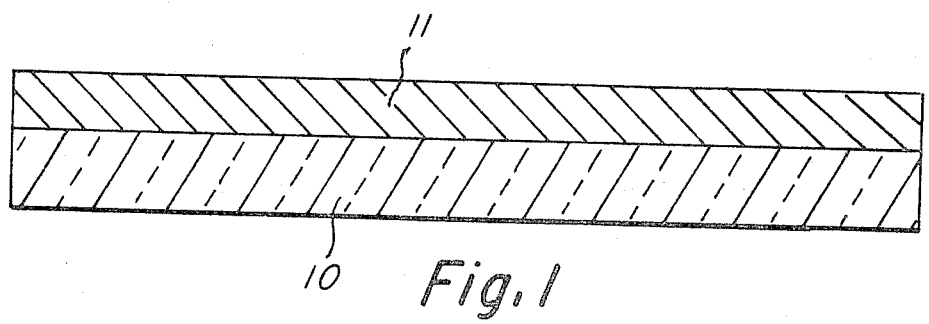
FIG. 1 is a cross-sectional view illustrating an initial stage in the method of fabricating a monolithic display structure having semiconductor integrated circuits combined therewith in accordance with the present invention, wherein a layer of polycrystalline semiconductor material has been formed on a substrate.

Referring more specifically to the drawings, FIG. 1 illustrates a cross-sectional view at an initial stage of the method of fabricating a monolithic display structure having integrated semiconductor devices combined therewith in accordance with the present invention. To this end, the method contemplates the use of a substrate 10 of transparent material which preferably may be quartz (i.e., crystalline silicon dioxide), fused silica, or a glass plate (i.e., amorphous silicon). The transparency of the substrate 10 is important in contributing to the versatility of the display structure to be fabricated, but it will be understood that in its broadest context, the method herein contemplated could involve the use of a non-transparent substrate. In this respect, the substrate may be of a composite form comprised of two or more layers, such as layers of silicon and an insulator which may be silicon dioxide or a composite insulator of silicon dioxide and silicon nitride, for example. Initially, a layer 11 of polycrystalline semiconductor material is deposited on a surface of the substrate 10 by suitable means. In this connection, the polycrystalline semiconductor layer 11 is preferably polycrystalline silicon to take advantage of the demonstrated stability and reliability of integrated silicon device technology, inasmuch as the layer 11 upon subsequent patterning and treatment as hereinafter described is intended to serve as the medium in which semiconductor devices are to be formed. The polysilicon material defining the layer 11 may be deposited directly onto the transparent substrate 10 without requiring an intermediate layer of insulating material such as silicon nitride or silicon dioxide. Typically, the polysilicon material of the layer 11 would be formed by low pressure chemical vapor deposition of any suitable silicon hydride having the general formula $Si_nH_{2n+2}$, such as $SiH_4$, and would have a relatively small grain size in the range of 100 nanometers. Trichlorosilane ($SiCl_3H$) can be employed as a chemical reagent from which polysilicon material can be deposited as the layer 11.

Figure 2:
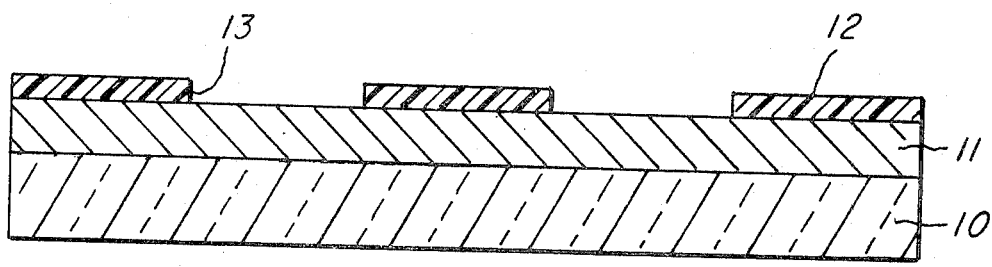
FIG. 2 is a cross-sectional view similar to FIG. 1, but showing a subsequent step in the method, wherein a photoresist mask has been formed on the layer of polycrystalline semiconductor material.
Figure 3:
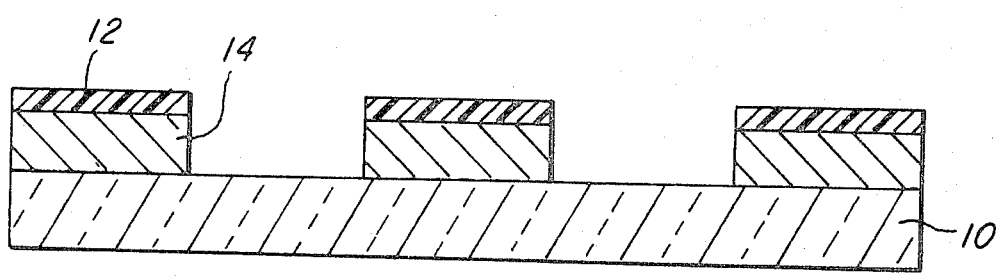
FIG. 3 is a cross-sectional view illustrating the patterning of the polycrystalline semiconductor layer by etching into a plurality of islands.
Figure 4A:
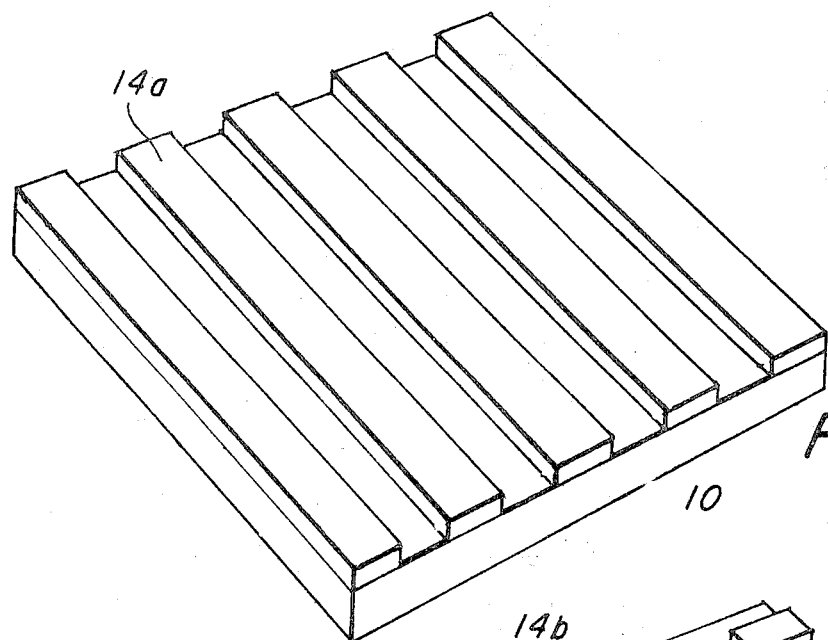
FIG. 4a is a perspective view of the structure illustrated in FIG. 3, and showing one form of the patterned islands of polycrystalline semiconductor material.
Figure 4B:
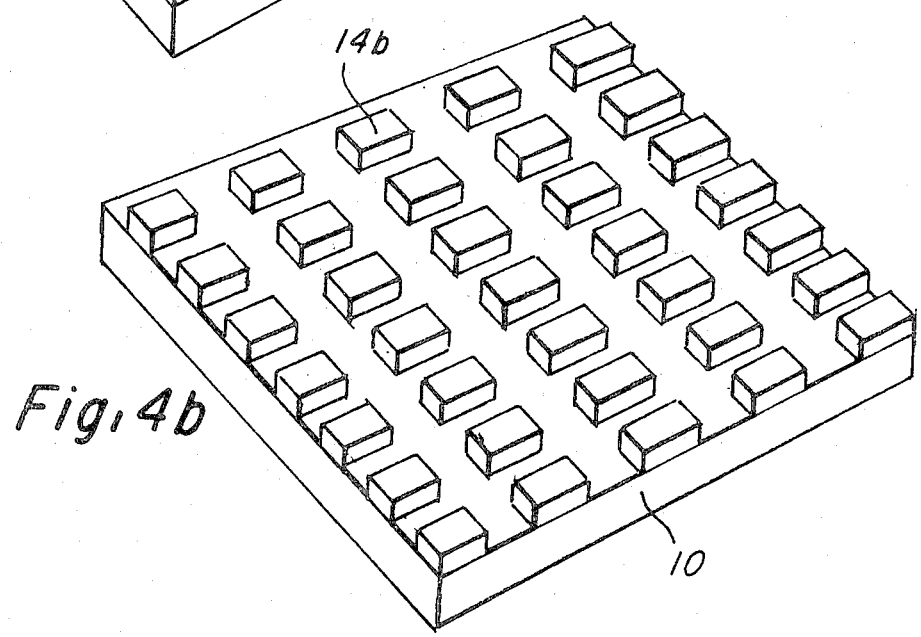
FIG. 4b is a perspective view similar to FIG. 4a, but showing another form which the patterned islands of polycrystalline semiconductor material may assume.
Figure 5:
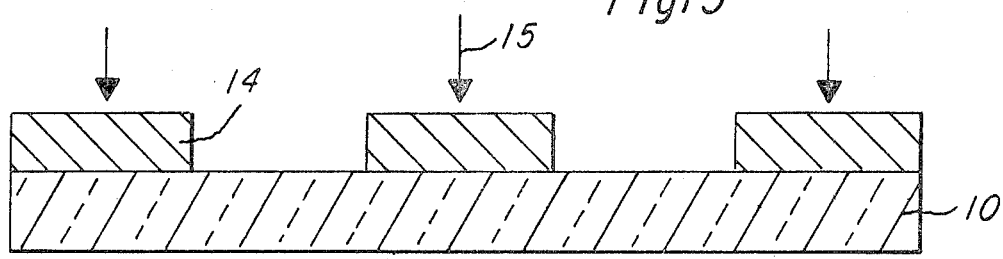
FIG. 5 is a cross-sectional view illustrating a subsequent method step, wherein the patterned islands of polycrystalline semiconductor material are subjected to a laser scanning treatment to induce annealing and recrystallization thereof.

In accordance with the present invention, it is proposed to subject the layer 11 of polysilicon material to a source of focused energy, such as a laser beam or an electron beam, at a sufficient intensity to cause recrystallization thereof with the purpose of obtaining an enhanced electron mobility characteristic therefor. It has been determined experimentally that efforts to recrystallize the polysilicon material of the layer 11 by subjecting the layer to a scanned laser beam in accomplishing laser annealing thereof causes problems because of the difference in the coefficient of heat expansion as between the polysilicon material of the layer 11 and the quartz or glass material of the substrate 10. In this connection, laser annealing of the thin polysilicon layer (i.e., a polysilicon layer 0.5 μm thick on a quartz substrate of two inch thickness) resulted in cracking of the thin polysilicon layer. Thus, to avoid the creation of undue stresses in the polysilicon material, the layer 11 is patterned by a suitable photolithographic technique by initially depositing a layer of photoresist material 12 onto the polysilicon layer 11, imparting a latent image in the resist layer 12 of the desired pattern, and developing the resist to open up windows 13 therethrough. The patterned resist layer 12 serves as an etchant mask in exposing selected surface portions of the polysilicon layer 11, as shown in FIG. 2. Thereafter, the polysilicon layer 11 is subjected to a selective etchant, such as an appropriate plasma etching procedure, to remove polysilicon material in the selected regions of the layer 11 down to the surface of the substrate 10 which is now exposed, as shown in FIG. 3. Depending upon the particular pattern imparted to the resist mask 12, the layer 11 of polysilicon material upon being selectively etched is transformed into a plurality of islands 14 of polysilicon material which may be arranged as a plurality of spaced elongated polysilicon islands 14a as shown in FIG. 4a or as a plurality of polysilicon islands 14b arranged in spaced checkerboard fashion in rows and columns in the manner depicted in FIG. 4b.

After the polysilicon layer 11 has been transformed into the plurality of polysilicon islands 14 by selective etching thereof in the manner described, and the photoresist mask has been removed, the polysilicon islands are then subjected to a focused energy source, preferably in the form of a scanned laser beam as depicted by the arrows 15 at an intensity sufficient to cause recrystallization of the polysilicon material forming the plurality of islands 14. By way of example, polysilicon islands having a thickness of 0.5 μm on a two inch quartz substrate were annealed with 0.6 watts of the 501.7 nm line of an argon ion laser focused by a 150 mm lens. The laser spot was scanned at 10.4 cm/sec with the line-to-line step size being of the order of 7 μm. The quartz substrate 10 was held at 500° C. This laser annealing of the polysilicon islands 14 caused recrystallization of the polysilicon material, wherein the polysilicon material was converted to crystalline silicon having an enhanced electron mobility characteristic of the order of 340–450 $cm^2$/volt-sec. Such an enhanced electron mobility characteristic approximates 50–70% of the electron mobility characteristic for bulk monocrystalline silicon MOSFETS and is of a quality appropriate for forming semiconductor devices therein. Optimally, the laser annealing of the polysilicon islands should cause the polysilicon material to change its crystalline structure in a manner approaching single-crystal silicon or even achieving monocrystallinity, but effective results in forming semiconductor devices in the laser-annealed polysilicon islands 14 are achievable even though the silicon material retains its polycrystalline character although in a changed state. The initial etching of a surface relief grating in the quartz or amorphous silicon substrate 10 prior to the deposition of the polysilicon layer 11 may further improve the quality of the crystalline structure of the polysilicon islands 14 following the laser annealing thereof. Accompanying the enhanced electron mobility characteristic of the recrystallized polysilicon in the islands 14 following the laser annealing treatment thereof is a substantial increase in the grain size of the polysilicon material which withstood the laser annealing treatment without cracking.

Figure 6:
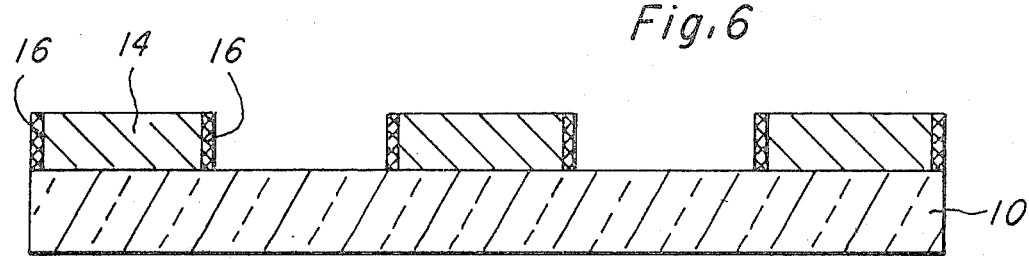
FIG. 6 is a cross-sectional view of the structure including the patterned islands of polycrystalline semiconductor material following the laser-annealing treatment thereof, and showing marginal portions of the respective islands with laser-induced distorted regions appearing as shaded lines.
Figure 7:
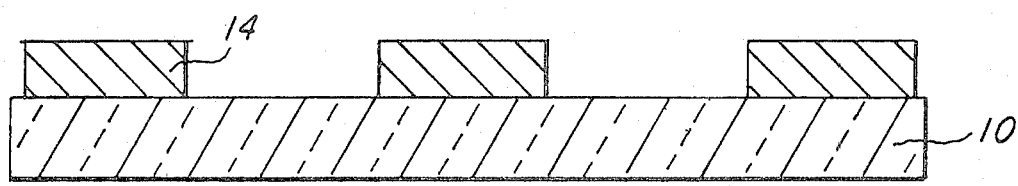
FIG. 7 is a cross-sectional view of the patterned polycrystalline semiconductor islands on the substrate, following removal of the laser-induced marginal distorted regions as shown in FIG. 6.

A further consequence of the laser annealing treatment of the islands 14 is the formation of randomly configured bulges about the marginal portions of the individual islands and also marginal edge regions of unannealed polysilicon material. This aspect of the method according to the present invention is illustrated in FIG. 6, where the laser-induced marginal distorted regions 16 are shown as shaded lines. In addition, there may be some edge regions of the islands 14 which are of unannealed character interspersed in the same general marginal portions of the respective islands 14 containing the laser-induced distorted regions 16. The laser-induced distorted regions 16 generally appear as randomly configured bulges or protuberances on surfaces of the islands 14. These laser-induced distorted regions 16 and any unannealed edge regions are removed from the respective islands 14 by a suitable etchant procedure, such as selective plasma etching, to insure proper performance from the semiconductor devices subsequently formed in the individual islands 14. Following the selective plasma etching to remove the unannealed edge regions and the laser-induced distorted regions 16 from the respective islands 14, the structure then appears as illustrated in FIG. 7. The individual islands 14 are now of somewhat reduced size and of a decreased volumetric extent due to the removal of the unannealed edge regions and laser-induced distorted regions 16 therefrom. The reduction in volume may be as much as 20% of the total volume of the islands 14 prior to the selective etching thereof in the manner described. In the latter respect, where the islands are initially formed as elongated polysilicon islands 14a as in FIG. 4a, generally a second patterning procedure is desired to subdivide the elongated islands 14a into a plurality of smaller islands of the general configuration of the islands 14b of FIG. 4b. This patterning procedure may be the same as the patterning procedure employed in patterning the polysilicon layer 11 to form the elongated islands 14a and may be combined with the procedure for removing the laser-induced distorted regions 16 and any unannealed edge regions from the respective elongated islands 14a, wherein the second patterning procedure sub-dividing the elongated islands 14a into a plurality of smaller islands simultaneously causes the laser-induced distortion regions 16 and any unannealed edge regions to be removed. This approach has the advantage of reducing the total amount of material removed from the islands as unannealed edge regions and laser-induced distorted regions such that following the second patterning procedure, the resulting islands (FIG. 7) will have a somewhat greater size and volumetric extent for forming electronic devices therein than if the islands had been initially formed as the polysilicon islands 14b in FIG. 4b. Of course, the latter approach ordinarily would not involve a second patterning procedure.

Figure 8:
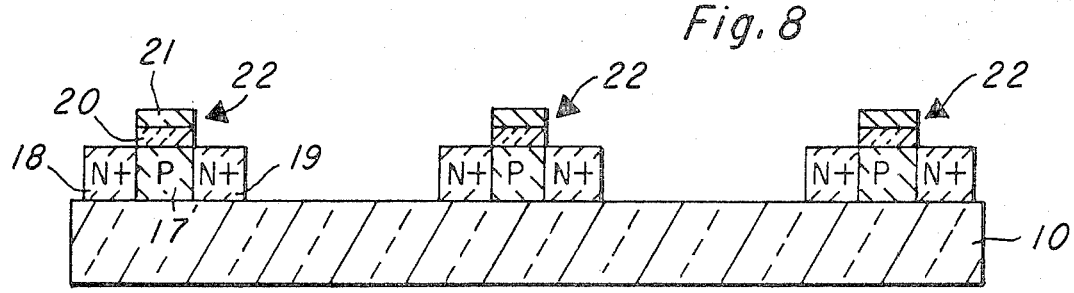
FIG. 8 is a cross-sectional view of the monolithic structure after subsequent processing steps forming semiconductor devices in the patterned islands.
Figure 12:
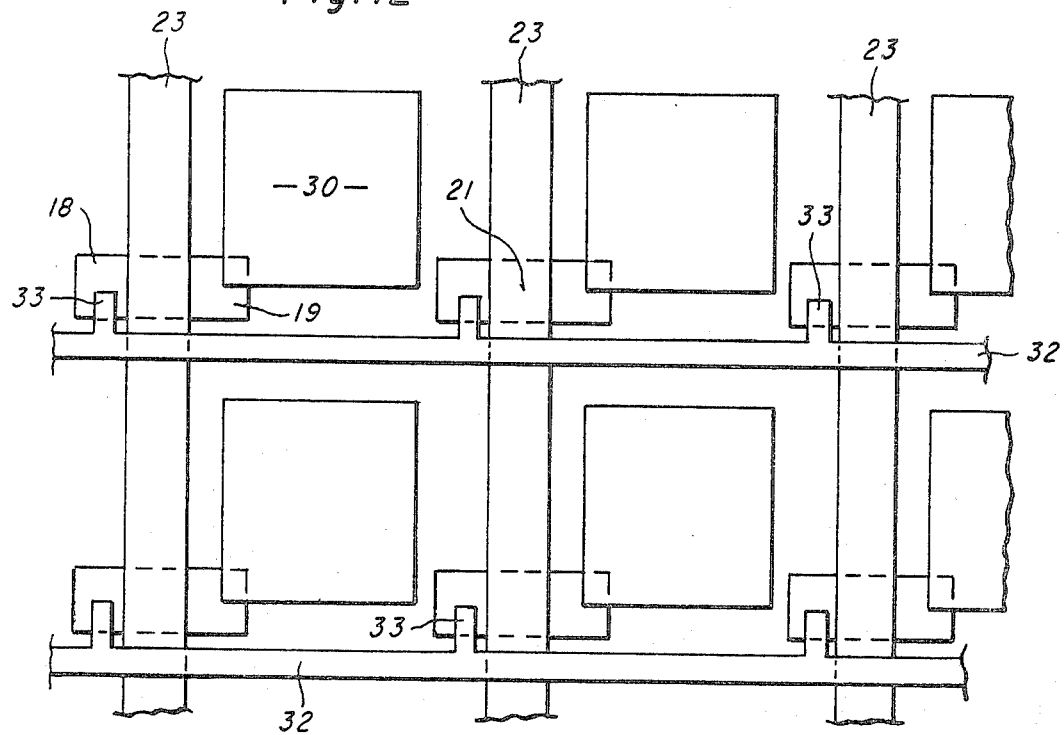
FIG. 12 is a fragmentary top plan view looking down on the monolithic structure illustrated in FIG. 11.

The individual islands 14 are now of crystalline silicon material possessing an electron mobility characteristic of a magnitude suitable for the formation of operable semiconductor devices therein. To this end, appropriate N-type and P-type conductivity dopant materials are employed in a suitable processing sequence to form N-type and P-type regions in respective islands 14. As illustrated in FIG. 8, each respective island 14 is appropriately doped to form an intermediate P-type body portion 17 flanked by N+ regions 18, 19 on opposite sides thereof and comprising source and drain regions respectively. An insulating layer in the form of silicon dioxide is then formed on the structure by thermal growth or suitable deposition and is subsequently patterned to define respective gate oxides 20 atop each of the islands 14 and in registration with the intermediate P-type body portion 17 thereof. Similarly, a first metallization layer is deposited and patterned to define respective gate electrodes 21 overlying the gate oxides 20 and atop each of the islands 14. In the latter respect, the oxide layer and the metal layer for forming the respective gate oxides 20 and gate electrodes 21 may be deposited in sequence, and the patterning thereof may then follow in sequence using appropriate photolithography and selective etchant procedures. The gate electrodes 21 of the semiconductor devices 22 in each column of an x-y matrix array of such devices are photolithographically defined and etched as integral components of respective parallel elongated conductors or conductive strips 23 which comprise a first set of electrodes, wherein a single elongated conductor or conductive strip 23 provides the gate electrodes 21 included in each column. This completes the formation of a matrix array of MOSFET address transistors to be associated with corresponding display components in the form of a display electrode of each display cell unit or pixel, as hereinafter described. A silicon dioxide layer 25 is then deposited to cover the active surface area of the substrate 10 and the address transistors 22 arranged thereon in an x-y matrix array, FIG. 9, and openings are formed in the oxide layer 25 by employing appropriate photolithographic procedures and selective etching of the oxide layer 25, there being an opening 26 through the oxide layer 25 communicating with each of the source regions 18 of the respective address transistors 22 and an opening 27 communicating with the drain region 19 of each address transistor 22, FIG. 10. Thereafter, a second metallization layer is deposited onto the structure assembly and is appropriately patterned by photolithography to form an x-y matrix array of display electrodes 30 electrically connected to the drain regions 19 of the respective address transistors 22 by a metal connector or contact 31 integral therewith. Patterning of the second metallization layer also forms a second set of electrodes as thin parallel elongated conductors or conductive strips 32 orthogonally related to the first set of electrodes 23 (FIG. 12). Each electrode 32 in the second set of electrodes has a plurality of conductive members in the form of arms 33 integral therewith and extending generally perpendicularly with respect thereto into overlying registration with the source regions 18 common to a respective single row of the address transistors 22, being electrically connected thereto by respective metal connectors or contacts 34 integral therewith and extending through the openings 26 communicating with the source regions 18. Thus, a single elongated conductor or conductive strip 32 is electrically connected to all of the source regions 18 of the address transistors 22 included in each row of the x-y matrix array. Thus, an x-y matrix array of display electrodes 30 is provided, each display electrode 30 comprising a single display cell unit or pixel and having a corresponding address transistor 22 electrically interconnected therewith. The first and second sets of electrodes 23, 32 although spaced apart in electrically isolated relationship with respect to each other form intersection points respectively corresponding to a single address transistor 22 and the display electrode 30 associated therewith (FIG. 12). The array of display electrodes 30 and the second set of electrodes 32 comprising the patterned second metallization layer are protected from exposure to the corrosive effect of an electro-optic material to be employed in the display as hereinafter described by depositing a thin transparent layer 35 of insulating material, such as silicon dioxide, as a protective coating thereon (FIG. 13).

Figure 13:
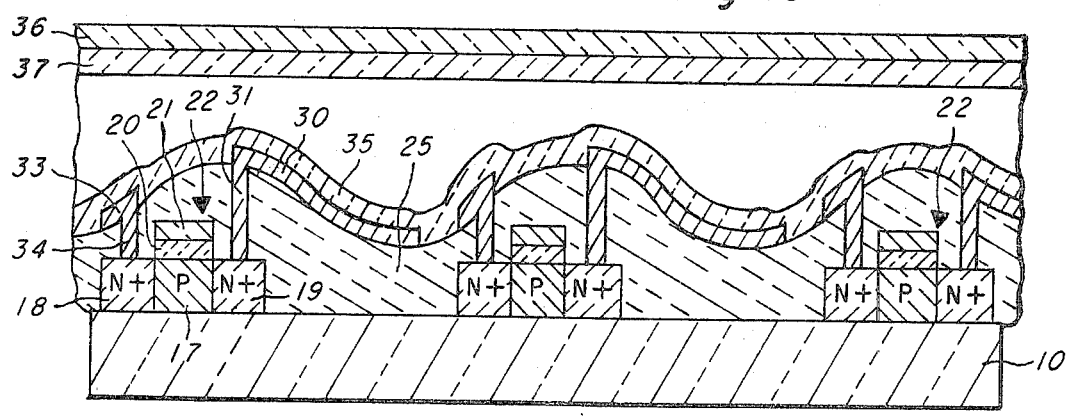
FIG. 13 is a cross-sectional view showing a fragmentary portion of the completed monolithic display structure having integrated semiconductor circuit devices combined therewith.
Figure 14:
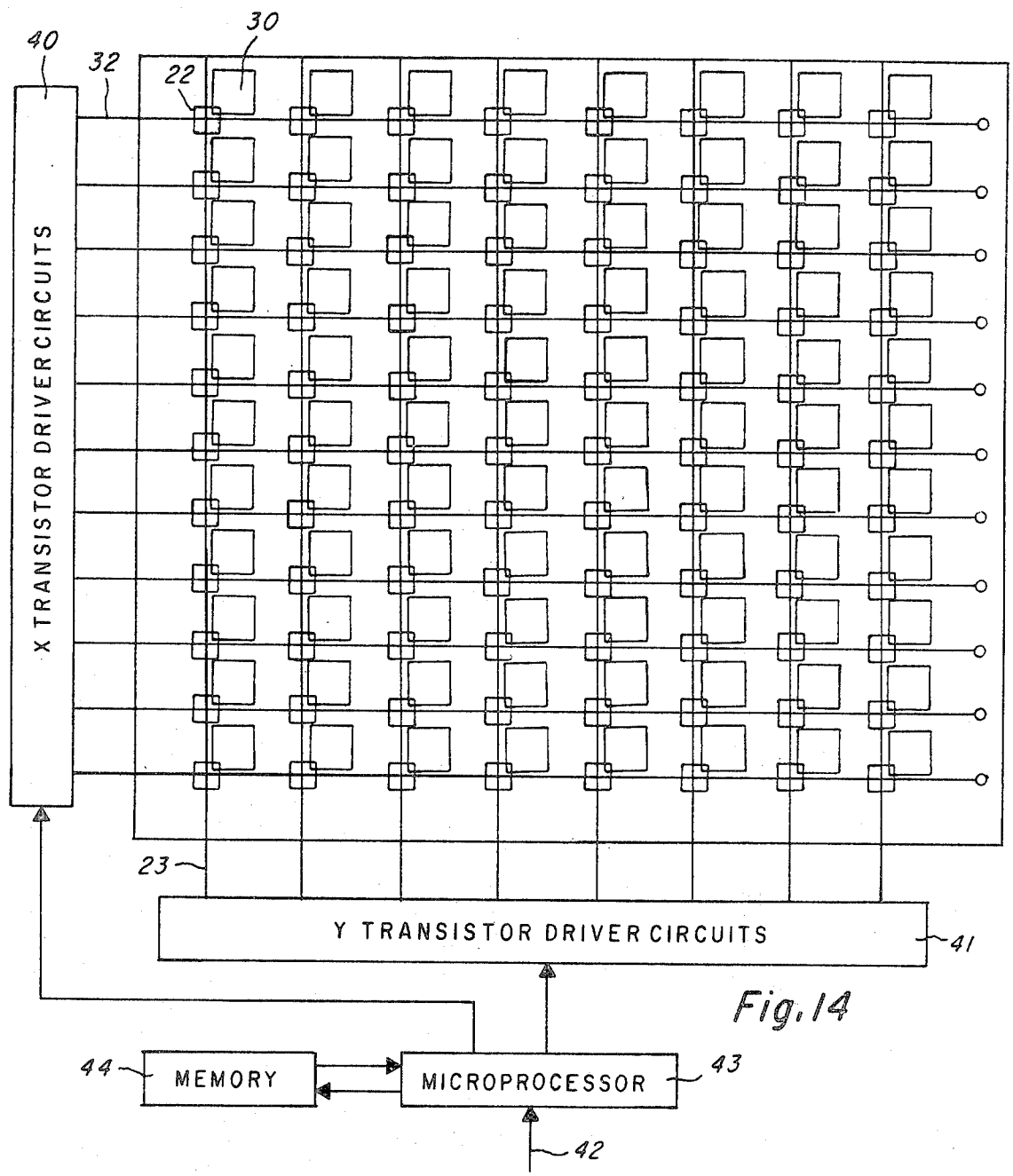
FIG. 14 is a block diagram of the monolithic display structure as fabricated in accordance with the present invention to include integrated semiconductor devices and driver circuitry as incorporated into an intelligent display system utilizing data processing and memory in association therewith.
Figure 15:
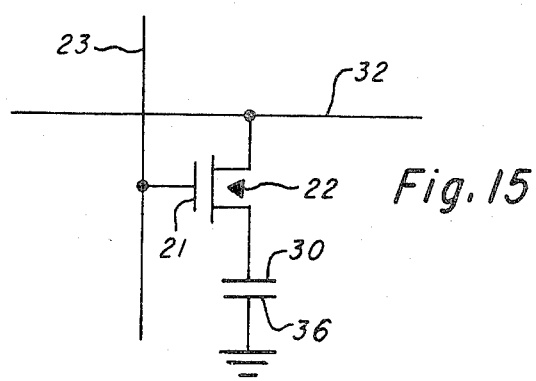
FIG. 15 is a schematic electronic circuit diagram representing a display cell unit or pixel and the MOSFET address transistor associated therewith.

The display structure is then completed by adding a top transparent electrode 36 having a conductive transparent coating 37 on the surface thereof opposed to the x-y matrix of lower electrodes 30 and in spaced relationship with respect thereto, as shown in FIG. 13. The top transparent electrode 36 covers the active area of the display structure in spaced overlying relationship with respect to the array of electrodes 30 and forms the top wall of a hermetic housing which encloses the matrix assembly of address transistors 22 and electrodes 30 therein. In this instance, the substrate 10 may provide the bottom wall of the housing. The flat panel display is completed by introducing an electro-optic material, such as an appropriate liquid crystal composition, into the space between the lower electrodes 30 and the upper transparent electrodes 36 to fill the chamber within the hermetic housing. Appropriate driver circuitry respectively associated with the first and second sets of electrodes 23 and 32 is also provided in crystalline silicon islands resulting from the laser annealing treatment as hereinbefore described, wherein the crystalline silicon islands are located on the substrate 10 outwardly with respect to the hermetic housing in which the liquid crystal display is contained. Thus, as shown in FIG. 14, x-line or row transistor driver circuitry 40 is electrically connected to the respective electrodes 32 included in the second set of electrodes, and y-line or column transistor driver circuitry 41 is electrically connected to each of the electrodes 23 included in the first set of electrodes orthogonally related to the second set of electrodes. An input signal 42 may be introduced to the monolithic display structure so as to energize the x and y transistor driver circuits 40 and 41 in a predetermined manner to selectively activate individual display cell units or pixels as defined by the x-y matrix array of lower electrodes 30. FIG. 15 schematically illustrates an electronic circuit diagram showing each MOSFET address transistor 22 as connected to the x-y electrodes 32, 23 and the liquid crystal display cell unit or pixel as identified by the lower electrode 30 and the upper electrode 36 defining a capacitive effect.

Referring again to FIG. 14, the monolithic display structure is incorporated into an intelligent display system, wherein data processing is employed in operating the display via a microprocessor 43 and a memory 44 associated therewith. The microprocessor 43 receives the input signal 42 and provides the x-line or row transistor driver circuitry 40 with a row timing pulse line and with a row information pulse line. The microprocessor 43 also provides the y-line or column transistor drive circuitry 41 with a column timing pulse line and with a column information pulse line. It will be understood that the complete intelligent display system may be fabricated on the same substrate, with the microprocessor 43 and the memory 44, like the driver circuitry, being fabricated in addition crystalline silicon islands as modified in accordance herewith by laser annealing provided on the substrate 10. Addressing of the display occurs one line at a time. As each line or row of the display cell units or pixels is addressed, data information is initially stored in a row of peripheral storage capacitors and in the source regions 18 of the addressed row. When the transistors 22 of the line are sequentially turned on by a positive pulse supplied by the y-line or column transistor driver circuitry 41, the charges in the source regions 18 are discharged via the drain re 'ons 19 into one line of display cell units or pixels simu taneously. During the period when each line or row of display cell units or pixels is being addressed, a constant negative bias is applied to the other rows to keep the address transistors 22 thereon turned "off". The intersections of the row and column sets of electrodes 32 and 23 which are energized identify the respective address transistors 22 which are rendered conductive or are turned "on". The display electrodes 30 corresponding to the "on" transistors 22 are thereby energized and bias the liquid crystal composition disposed thereover to cause selective dynamic light modulation, thereby displaying a dot at each display cell unit or pixel 30 so activated. In the latter respect, each display electrode 30 serves as one field plate of a capacitor whose other field plate is the transparent electrode 36 and conductive coating 37 forming the top wall of the display housing. The liquid crystal composition between the lower display electrodes 30 and the upper transparent electrode 36 serves as the dielectric of the capacitor array as so provided.

While the invention has been described with particular reference to the fabrication of a flat panel liquid crystal display, it will be understood that the flat panel display may take on other forms, such as electrochromic or electroluminescent displays, within the spirit of this invention. It is also contemplated that CMOS transistors could be employed as the address transistors with the monolithic display structure, in which case two islands of polycrystalline semiconductor material as annealed by energy from a focused energy source would be required per display cell unit or pixel.

Although the invention has been described with respect to specific preferred embodiments thereof, it will be understood that variations and modifications can be made within the scope of the invention by those skilled in the art. Therefore, it is intended that the appended claims be interpreted as broadly as reasonably permitted by the prior art to include all such variations and modifications within the scope of the present invention.

What is claimed is:

1. A process of fabricating a semiconductor structure comprising:
    forming a plurality of islands of polycrystalline semiconductor material disposed in spaced relation to each other on a substrate;
    subjecting said polycrystalline semiconductor islands to focused energy from a source thereof wherein the focused energy is at an intensity sufficient to cause recrystallization of the polycrystalline semiconductor material of said islands;
    converting the polycrystalline semiconductor material in said islands to crystalline semiconductor material having an enhanced electron mobility characteristic in response to the focused energy impinging thereon causing recrystallization thereof;
    removing any regions untreated by focused energy and focused energy-induced distorted regions from each of said islands of crystalline semiconductor material; and
    fabricating electronic devices in respective crystalline semiconductor islands.

2. A process of fabricating a semiconductor structure as set forth in claim 1, wherein the formation of said plurality of islands of polycrystalline semiconductor material on said substrate is accomplished by depositing a layer of polycrystalline semiconductor material on said substrate; and
    patterning said polycrystalline semiconductor layer to define said plurality of islands of polycrystalline semiconductor material disposed in spaced relation to each other on said substrate.

3. A process of fabricating a semiconductor structure as set forth in claim 1, wherein the focused energy to which said polycrystalline semiconductor islands are subjected is laser energy from a laser source maintained at an intensity sufficient to cause laser annealing and recrystallization of the polycrystalline semiconductor material in said islands.

4. A process of fabricating a semiconductor structure as set forth in claim 1, wherein the focused energy to which said polycrystalline semiconductor islands are subjected is energy from an electron beam maintained at an intensity sufficient to cause annealing and recrystallization of the polycrystalline semiconductor material in said islands.

5. A process of fabricating a semiconductor structure as set forth in claim 1, wherein the polycrystalline semiconductor material of said plurality of islands is polysilicon material.

6. The process of claim 1, wherein said substrate is transparent.

7. The process of claim 1, wherein said substrate comprises quartz.

8. A process of fabricating a semiconductor structure comprising:
   depositing a layer of polycrystalline semiconductor on a substrate;
   patterning said polycrystalline semiconductor layer to define a plurality of elongated islands of polycrystalline semiconductor material disposed in spaced parallel relation to each other on said substrate;
   successively scanning each of said plurality of elongated islands of polycrystalline semiconductor material with a laser beam maintained at an intensity sufficient to cause annealing and recrystallization of each elongated island of polycrystalline semiconductor material;
   converting the polycrystalline semiconductor material in each of said elongated islands to crystalline semiconductor material having an enhanced electron mobility characteristic in response to the scanning of the laser beam causing annealing and recrystallization thereof;
   removing any unannealed regions and laser-induced distorted regions from each of said elongated islands of crystalline semiconductor material;
   further patterning said elongated islands of crystalline semiconductor material to sub-divide each of said elongated islands into a plurality of smaller islands of crystalline semiconductor material disposed in spaced relation to each other on said substrate; and
   thereafter fabricating electronic devices in respective smaller islands of crystalline semiconductor material.

9. A process of fabricating a semiconductor structure as set forth in claim 8, wherein the step of further patterning said elongated islands of crystalline semiconductor material to sub-divide said elongated islands is responsible for removing any unannealed regions and laser-induced distorted regions from each of said elongated islands of crystalline semiconductor material which occurs simultaneously therewith.

10. The process of claim 8, wherein said substrate is transparent.

11. The process of claim 8, wherein said substrate comprises quartz.

12. A process of fabricating a monolithic display structure combined with semiconductor integrated circuits on the same substrate comprising:
   forming a plurality of islands of polycrystalline semiconductor material disposed in spaced relation to each other on a substrate;
   subjecting said polycrystalline semiconductor islands to focused energy from a source thereof maintained at an intensity sufficient to cause recrystallization of the polycrystalline semiconductor material of said islands;
   converting the polycrystalline semiconductor material in said islands to crystalline semiconductor material having an enhanced electron mobility characteristic in response to the impingement of the focused energy thereon causing recrystallization thereof;
   removing any untreated regions and focused energy-induced distorted regions from each of said islands of crystalline semiconductor material;
   fabricating electronic devices in respective crystalline semiconductor islands; and
   forming an electronically operable display on the same side of said substrate as said electronic devices including respective display units electrically interconnected with a corresponding one of said electronic devices.

13. A process of fabricating a monolithic display structure as set forth in claim 12, wherein the formation of said plurality of islands of polycrystalline semiconductor material on said substrate is accomplished by depositing a layer of polycrystalline semiconductor material on said substrate; and
   patterning said polycrystalline semiconductor layer to define said plurality of islands of polycrystalline semiconductor material disposed in spaced relation to each other on said substrate.

14. A process of fabricating a monolithic display structure as set forth in claim 13, further including etching a relief grating in the surface of said substrate prior to the deposition of the layer of polycrystalline semiconductor material on the said surface of said substrate.

15. A process of fabricating a monolithic display structure as set forth in claim 12, wherein the focused energy to which said polycrystalline semiconductor islands are subjected is energy from an electron beam maintained at an intensity sufficient to cause annealing and recrystallization of the polycrystalline semiconductor material in said islands.

16. A process of fabricating a monolithic display structure as set forth in claim 12, wherein the focused energy to which said polycrystalline semiconductor islands are subjected is laser energy from a laser source maintained at an intensity sufficient to cause laser annealing and recrystallization of the polycrystalline semiconductor material in said islands.

17. A process of fabricating a monolithic display structure as set forth in claim 16, wherein said display units are formed as an array of display pixels arranged in rows and columns with each display pixel being electrically interconnected with one of said electronic devices.

18. A process of fabricating a monolithic display structure as set forth in claim 17, wherein said electronic devices are fabricated as metal-oxide-semiconductor field effect transistors in said crystalline semiconductor islands.

19. A process of fabricating a monolithic display structure as set forth in claim 18, wherein the polycrystalline semiconductor material of said plurality of islands is polysilicon material.

20. A process of fabricating a monolithic display structure as set forth in claim 19, wherein the display which is formed is a liquid crystal display.

21. The process of claim 12, wherein said substrate is transparent.

22. The process of claim 12, wherein said substrate comprises quartz.

23. A process of fabricating a monolithic display structure combined with semiconductor integrated circuits on the same substrate comprising:
   depositing a layer of polycrystalline semiconductor material on a substrate;
   patterning said polycrystalline semiconductor layer to define a plurality of elongated islands of polycrystalline semiconductor material disposed in spaced parallel relation to each other on said substrate;
   successively scanning each of said plurality of elongated islands of polycrystalline semiconductor material with a laser beam maintained at an intensity sufficient to cause annealing and recrystallization of each elongated island of polycrystalline semiconductor material;

converting the polycrystalline semiconductor material in each of said elongated islands to crystalline semiconductor material having an enhanced electron mobility characteristic in response to the scanning of the laser beam causing annealing and recrystallization thereof;

removing any unannealed regions and laser-induced distorted regions from each of said elongated islands of crystalline semiconductor material;

further patterning said elongated islands of crystalline semiconductor material to sub-divide each of said elongated islands into a plurality of smaller islands of crystalline semiconductor material disposed in spaced relation to each other on said substrate;

fabricating electronic devices in respective smaller islands of crystalline semiconductor material; and forming an electronically operable display on the same side of said substrate as said electronic devices including respective display units electrically interconnected with a corresponding one of said electronic devices.

24. A process of fabricating a monolithic display structure combined with semiconductor integrated circuits as set forth in claim 23, wherein the step of further patterning said elongated islands of crystalline semiconductor material to sub-divide said elongated islands is responsible for removing any unannealed regions and laser-induced distorted regions from each of said elongated islands of crystalline semiconductor material which occurs simultaneously therewith.

25. The process of claim 23, wherein said substrate is transparent.

26. The process of claim 23, wherein said substrate comprises quartz.

* * * * *